United States Patent
Kuo et al.

(10) Patent No.: US 10,879,161 B2
(45) Date of Patent: Dec. 29, 2020

(54) SEMICONDUCTOR PACKAGES HAVING A SEED LAYER STRUCTURE PROTRUDING FROM AN EDGE OF METAL STRUCTURE

(71) Applicant: Taiwan Semiconductor Manufacturing Co., Ltd., Hsinchu (TW)

(72) Inventors: Hung-Jui Kuo, Hsinchu (TW); Hui-Jung Tsai, Hsinchu (TW); Jyun-Siang Peng, Hsinchu (TW); Chien-Tang Peng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/431,751

(22) Filed: Jun. 5, 2019

(65) Prior Publication Data

US 2020/0075470 A1 Mar. 5, 2020

Related U.S. Application Data

(60) Provisional application No. 62/725,272, filed on Aug. 31, 2018.

(51) Int. Cl.
*H01L 23/498* (2006.01)
*H01L 21/48* (2006.01)

(52) U.S. Cl.
CPC .... *H01L 23/49822* (2013.01); *H01L 21/4857* (2013.01); *H01L 23/49811* (2013.01); *H01L 23/49816* (2013.01); *H01L 23/49827* (2013.01); *H01L 23/49838* (2013.01); *H01L 23/49866* (2013.01)

(58) Field of Classification Search
CPC ....... H01L 2224/023; H01L 2224/0233; H01L 2224/02331; H01L 2224/0235; H01L 2224/02373; H01L 2224/13008; H01L 2224/13024; H01L 23/49811; H01L 23/49822; H01L 23/49836; H01L 23/49866
See application file for complete search history.

(56) References Cited

U.S. PATENT DOCUMENTS

| | | | |
|---|---|---|---|
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2019/0157240 A1* | 5/2019 | Tsai | H01L 24/97 |

\* cited by examiner

*Primary Examiner* — Hoai V Pham
(74) *Attorney, Agent, or Firm* — JCIPRNET

(57) ABSTRACT

Conductive structures, semiconductor packages and methods of forming the same are disclosed. A semiconductor package includes at least one die and a redistribution layer. The redistribution layer is disposed over and electrically to the at least one die and includes a seed layer structure and a metal feature over the seed layer structure. In some embodiments, an edge of the seed layer structure is protruded from an edge of the metal feature and has a surface roughness Rz greater than 10 nm.

20 Claims, 15 Drawing Sheets

_US 10,879,161 B2_

SEMICONDUCTOR PACKAGES HAVING A SEED LAYER STRUCTURE PROTRUDING FROM AN EDGE OF METAL STRUCTURE

CROSS-REFERENCE TO RELATED APPLICATION

This application claims the priority benefits of U.S. provisional application Ser. No. 62/725,272, filed on Aug. 31, 2018. The entirety of the above-mentioned patent application is hereby incorporated by reference herein and made a part of this specification.

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area.

These smaller electronic components also require smaller packages that occupy less area than previous packages. Examples of types of semiconductor packages include quad flat packages (QFP), pin grid array (PGA) packages, ball grid array (BGA) packages, flip chips (FC), three-dimensional integrated circuits (3DICs), wafer level packages (WLPs), and package on package (PoP) devices, etc. Although existing semiconductor packages have been generally adequate for their intended purposes, they have not been entirely satisfactory in all respects.

DETAILED DESCRIPTION

Figure 1:
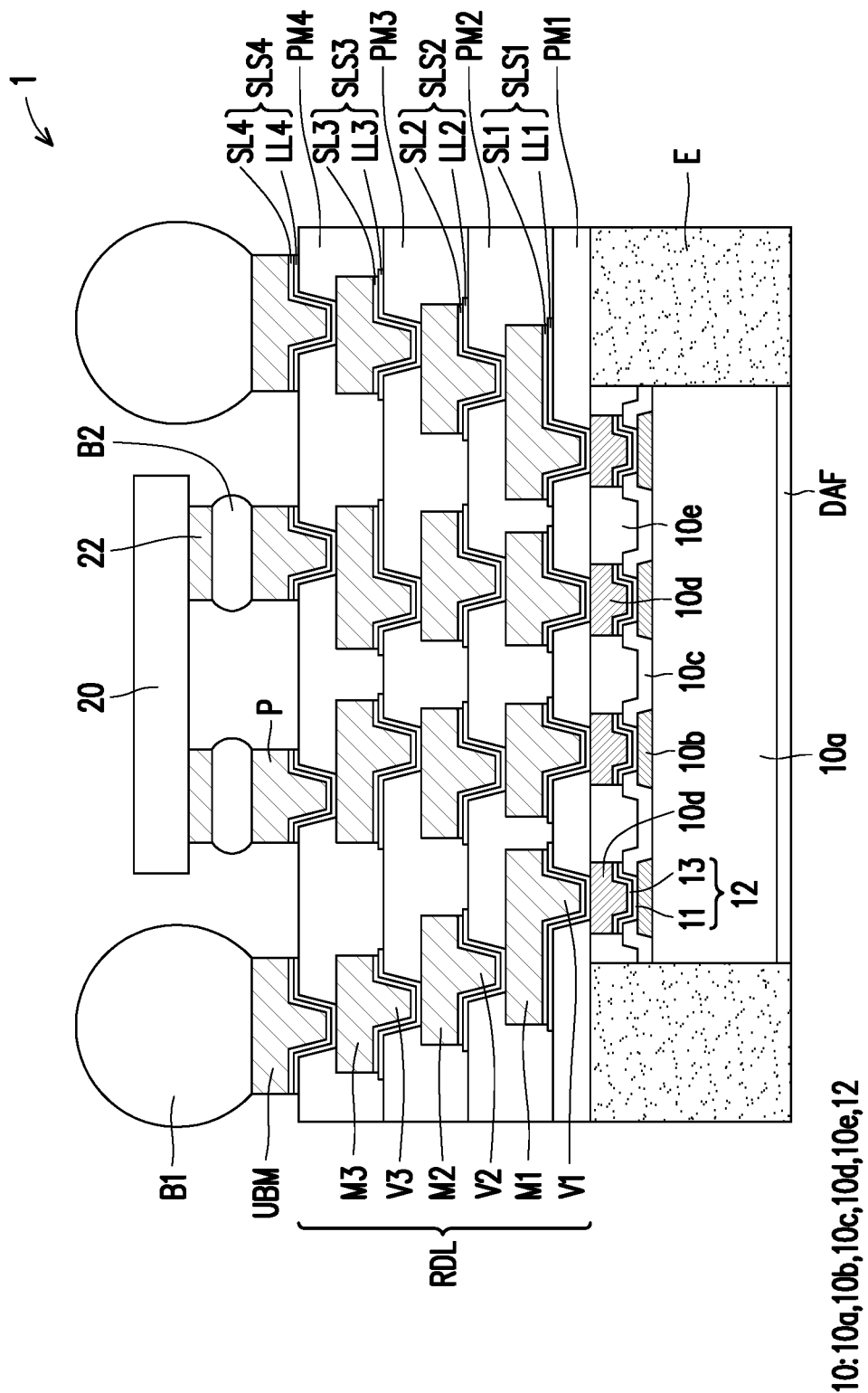
FIG. 1 is a cross-section view of a semiconductor package in accordance with some embodiments.

The following disclosure provides many different embodiments, or examples, for implementing different features of the provided subject matter. Specific examples of components and arrangements are described below for the purposes of conveying the present disclosure in a simplified manner. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the same reference numerals and/or letters may be used to refer to the same or similar parts in the various examples the present disclosure. The repeated use of the reference numerals is for the purpose of simplicity and clarity and does not in itself dictate a relationship between the various embodiments and/or configurations discussed.

Further, spatially relative terms, such as "beneath", "below", "lower", "on", "over", "above", "upper" and the like, may be used herein to facilitate the description of one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
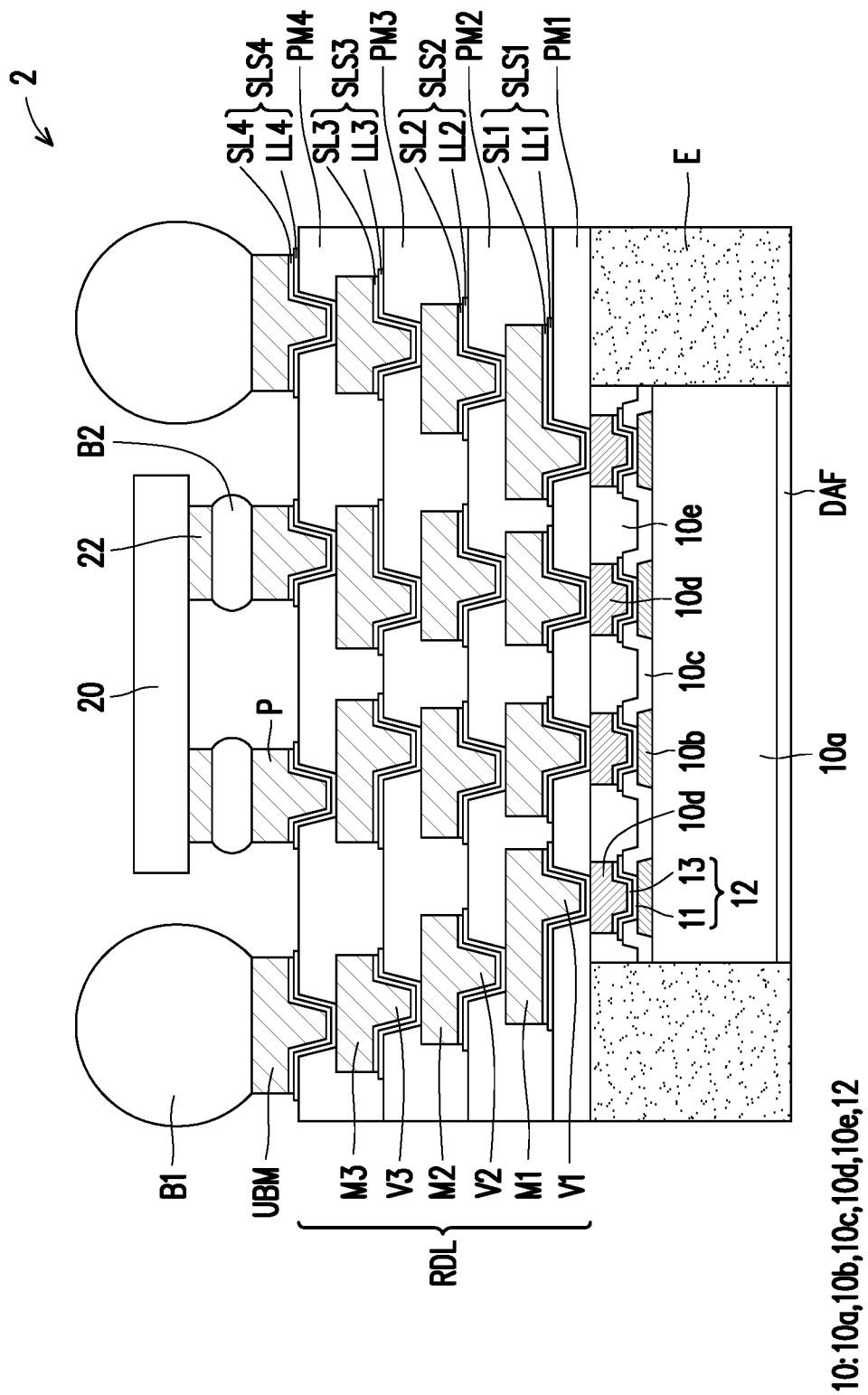
FIG. 2 is a cross-section view of a semiconductor package in accordance with some embodiments.

FIG. 1 is a cross-section view of a semiconductor package in accordance with some embodiments. FIG. 2 is a cross-section view of a semiconductor package in accordance with some embodiments. FIGS. 3A to 3F are cross-sectional views of a method of forming a conductive structure of a semiconductor package in accordance with some embodiments. In some embodiments, the semiconductor package of FIG. 1 or FIG. 2 is an integrated fan-out (InFO) package, and the conductive structure is a redistribution layer structure, but the disclosure is not limited thereto. The disclosure may be applied to an integrated fan-in package as needed.

Referring to FIG. 1, a semiconductor package 1 including at least one die 10 is provided. The die 10 may be an application-specific integrated circuit (ASIC) chip, an analog chip, a sensor chip, a wireless and radio frequency chip, a voltage regulator chip or a memory chip, for example. In some embodiments, the die 10 may include an active component or an integrated active device (IAD).

In some embodiments, the die 10 includes a substrate 10a, at least one pad 10b over the substrate 10a, a passivation layer 10c over the substrate 10a and exposing a portion of the pad 10b, at least one connector 10d over the passivation layer 10c and electrically connected to the pad 10b, and a protection layer 10e over the passivation layer 10c and aside the at least one connector 10d. The substrate 10a may include bulk silicon, doped or undoped, or an active layer of a semiconductor-on-insulator (SOI) substrate. The substrate 10a may have a device layer that includes a gate, source/drain regions, an interconnection structure, etc. The pad 10b may be electrically connected to the device layer and may include aluminum. Each of the passivation layer 10c and the protection layer 10e may include a dielectric material such as silicon oxide, silicon nitride or silicon oxynitirde, a polymer material such as polybenzoxazole (PBO), polyimide (PI) or benzocyclobutene (BCB), or the like. The passivation layer 10c may include a material different from that of the protection layer 10e.

In some embodiments, the die 10 further includes a seed layer structure 12 between the connector 10d and the pad 10b. In some embodiments, the seed layer structure 12 is a multi-layer structure including a lining layer 11 and an overlying seed layer 13. The lining layer 11 is configured to enhance the adhesion between the connector 10d and the underlying pad 10d, and is referred to as a glue layer or an adhesion layer in some examples. The lining layer 11 may serve as a barrier layer to prevent the diffusion of a metal into the underlying material, and is referred to as a barrier layer in some examples. The lining layer 11 is a part of the seed layer structure 12, and is referred to a seed layer in some examples. In some embodiments, each of the lining layer 11, the seed layer 13 and the connector 10d includes Ti, Ta, Cu, W, Ru, Co, Ni or an alloy thereof. In some embodiments, the seed layer 13 may include a material different from that of the lining layer 11, but may include a material the same as that of the connector 10d. In some embodiments, the side of the die 10 with the connectors 10d is referred to as a front side throughout the description. In some embodiments, a die attach film DAF is provided on the backside of the die 10.

In some embodiments, an encapsulant E is further included in the semiconductor package 1. The encapsulant E is disposed aside the die 10. The encapsulant E surrounds the die 10, and exposes the surface of the connector 10d. The encapsulant E includes a molding compound such as epoxy, a photo-sensitive material such as polybenzoxazole (PBO), polyimide (PI) or benzocyclobutene (BCB), a combination thereof or the like. In some embodiments, through integrated fan-out vias TIV (not shown) are formed through the encapsulant E for providing electrical connection between the die and other metal features.

In some embodiments, a polymer layer PM1, a metal line M1 and at least one via V1 are further included in the semiconductor package 1. In some embodiments, the polymer layer PM1 is disposed over the die 10 and the encapsulant E. In some embodiments, the polymer layer PM1 includes polybenzoxazole (PBO), polyimide (PI), benzocyclobutene (BCB), a combination thereof or the like. In some embodiments, the at least one via V1 is disposed over and electrically connected to connector 10d of the die 10 and embedded by the polymer layer PM1, and the metal line M1 is disposed over the polymer layer PM1 and electrically connected to the at least one via V1.

In some embodiments, a seed layer structure SLS1 is disposed between the metal line M1 and the polymer layer PM1, between the via V1 and the polymer layer PM1 and between the via V1 and the corresponding connector 10d. In some embodiments, the seed layer structure SLS1 may include a lining layer LL1 and an overlying seed layer SL1. The lining layer LL1 may be referred to an adhesion layer, a barrier layer or a seed layer in some examples. In some embodiments, each of the lining layer LL1, the seed layer SL1, the metal line M1 and the at least one via V1 includes Ti, Ta, Cu, W, Ru, Co, Ni or an alloy thereof. In some embodiments, the seed layer SL1 may include a material different from that of the lining layer LL1, but may include a material the same as that of the metal line M1 or the at least one via V1. For example, the lining layer LL1 may include Ti, and the seed layer SL1, the metal line M1 and the at least one via V1 may include Cu.

In some embodiments, the edge of the seed layer structure SLS1 is protruded from the edge of metal line M1. In some embodiments, the edge of the lining layer LL1 is protruded from the edge of the metal line M1, while the edge of the seed layer SL1 is aligned with the edge of the metal line M1. In some embodiments, the protruding edge of the seed layer structure SLS1 is sandwiched by the adjacent polymers layer PM1 and PM2.

From another point of view, the lower portion (e.g., lining layer LL1) of the seed layer structure functions as a footing for the metal feature (e.g., metal line M1), and is referred to a footing seed layer in some examples. The footing seed layer is beneficial to enhance the interface adhesion between the metal and the adjacent polymer material, reduce the metal from diffusing to the underlying device and therefore stabilize the impedance during reliability test.

In some embodiments, a polymer layer PM2, a metal line M2 and at least one via V2 are further included in the semiconductor package 1. In some embodiments, the polymer layer PM2 is disposed over the polymer layer PM1 and surrounding the metal line M1 and the at least one via V2. In some embodiments, the polymer layer PM2 includes polybenzoxazole (PBO), polyimide (PI), benzocyclobutene (BCB), a combination thereof or the like. In some embodiments, the at least one via V2 is disposed over and electrically connected to metal line M1 and embedded by the polymer layer PM2, and the metal line M2 is disposed over the polymer layer PM2 and electrically connected to the at least one via V2.

In some embodiments, a seed layer structure SLS2 is disposed between the metal line M2 and the polymer layer PM2, between the at least one via V2 and the polymer layer PM2 and between the via V2 and the metal line M1. In some embodiments, the seed layer structure SLS2 may include a lining layer LL2 and an overlying seed layer SL2. The lining layer LL2 may be referred to an adhesion layer, a barrier layer or a seed layer in some examples. In some embodiments, each of the lining layer LL2, the seed layer SL2, the metal line M2 and the at least one via V2 includes Ti, Ta, Cu, W, Ru, Co, Ni or an alloy thereof. In some embodiments, the seed layer SL2 may include a material different from that of the lining layer LL2, but may include a material the same as that of the metal line M2 or the at least one via V2. For example, the lining layer LL2 may include Ti, and the seed layer SL2, the metal line M2 and the at least one via V2 may include Cu.

In some embodiments, the edge of the seed layer structure SLS2 is protruded from the edge of the metal line M2. In some embodiments, the edge of the lining layer LL2 is protruded from the edge of the metal line M2, while the edge of the seed layer SL2 is aligned with the edge of the metal line M2. In some embodiments, the protruding edge of the seed layer structure SLS2 is sandwiched by the adjacent polymer layers PM2 and PM3.

In some embodiments, a polymer layer PM3, a metal line M3 and at least one via V3 are further included in the semiconductor package 1. In some embodiments, the polymer layer PM3 is disposed over the polymer layer PM2 and surrounding the metal line M2 and the at least one via V3. In some embodiments, the polymer layer PM3 includes polybenzoxazole (PBO), polyimide (PI), benzocyclobutene (BCB), a combination thereof or the like. In some embodiments, the at least one via V3 is disposed over and electrically connected to metal line M2 and embedded by the polymer layer PM3, and the metal line M3 is disposed over the polymer layer PM3 and electrically connected to the at least one via V3.

In some embodiments, a seed layer structure SLS3 is disposed between the metal line M3 and the polymer layer PM3, between the via V3 and the polymer layer PM3 and between the via V3 and the metal line M2. In some embodiments, the seed layer structure SLS3 may include a lining layer LL3 and an overlying seed layer SL3. The lining layer LL3 may be referred to an adhesion layer, a barrier layer or a seed layer in some examples. In some embodiments, each of the lining layer LL3, the seed layer SL3, the metal line M3 and the at least one via V3 includes Ti, Ta, Cu, W, Ru, Co, Ni or an alloy thereof. In some embodiments, the seed layer SL3 may include a material different from that of the lining layer LL3, but may include a material the same as that of the metal line M3 or the at least one via V3. For example, the lining layer LL3 may include Ti, and the seed layer SL3, the metal line M3 and the at least one via V3 may include Cu.

In some embodiments, the edge of the seed layer structure SLS3 is protruded from the edge of the metal line M3. In some embodiments, the edge of the lining layer LL3 is protruded from the edge of the metal line M3, while the edge of the seed layer SL3 is aligned with the edge of the metal line M3. In some embodiments, the protruding edge of the seed layer structure SLS3 is sandwiched by the adjacent polymer layers PM3 and PM4.

In some embodiments, a polymer layer PM4 is further included in the semiconductor package 1. In some embodiments, the polymer layer PM4 is disposed over the polymer layer PM3 aside the metal line M3 and exposes a part of the metal line M3. In some embodiments, the polymer layer PM4 includes polybenzoxazole (PBO), polyimide (PI), benzocyclobutene (BCB), a combination thereof or the like.

In some embodiments, under bump metallization pads UBM are further included in the semiconductor package 1. The under bump metallization pads UBM are disposed over and electrically connected to the metal line M3. In some embodiments, connection pads P are formed during the operation of forming the under bump metallization pads UBM. The connection pads P are disposed over and electrically connected to the metal line M3. In some embodiments, the under bump metallization pads UBM surround the connection pads P.

In some embodiments, a seed layer structure SLS4 is disposed between the under bump metallization pad UBM and the polymer layer PM4 and between the under bump metallization pad UBM and the metal line M3. Similarly, a seed layer structure SLS4 is disposed between the connection pad P and the polymer layer PM4 and between the connection pad P and the metal line M3. In some embodiments, the seed layer structure SLS4 may include a lining layer LL4 and an overlying seed layer SL4. The lining layer LL4 may be referred to an adhesion layer, a barrier layer or a seed layer in some examples. In some embodiments, each of the lining layer LL4, the seed layer SL4 and the under bump metallization pads UBM includes Ti, Ta, Cu, W, Ru, Co, Ni or an alloy thereof. In some embodiments, the seed layer SL4 may include a material different from that of the lining layer LL4, but may include a material the same as that of the under bump metallization pads UBM or connection pads P. For example, the lining layer LL4 may include Ti, and the seed layer SL4, the under bump metallization pads UBM and the connection pads P may include Cu.

A redistribution layer structure RDL of the disclosure is thus completed. In some embodiments, the redistribution layer structure RDL includes the vias V1, V2 and V3, the metal lines M1, M2 and M3, and the seed layer structures SLS1, SLS2 and SLS3. In some embodiments, the redistribution layer structure RDL optionally includes the bump metallization pads UBM and the seed layer structure SLS4.

In some embodiments, bumps B1 are further included in the semiconductor package 1. The bumps B1 are disposed over and electrically connected to the under bump metallization pads UBM. In some embodiments, the bumps B1 include copper, solder, nickel or a combination thereof.

In some embodiments, at least one second die 20 is further included in the semiconductor package 1. The second die 20 is bonded to the connection pads P through micro-bumps B2. In some embodiments, a second die 20 having micro-bumps B2 is bonded to the connection pads P with the front side thereof facing the front-side redistribution layer structure RDL. In some embodiments, the second die 20 is an integrated passive device (IPD) including resistors, capacitors, inductors, resonators, filters, and/or the like. In alternative embodiments, the second die 20 may be an integrated active device (IAD) upon the process requirements. In some embodiments, the dimension of the bumps B1 is greater than (e.g., at least 3 times) the dimension of the micro-bumps B2.

In the above embodiments, a metal line is provided with a footing seed layer while a connector or bump is provided without a footing seed layer, as shown in FIG. 1. However, the present disclosure is not limited thereto. In alternative embodiments, a connector or bump may be provided with a footing seed layer, as shown in FIG. 2. For example, the edge of the lining layer 11 of the seed layer structure 12 is protruded out from the edge of the connector 10d, and/or the edge of the lining layer LL4 of the seed layer structure SLS4 is protruded out from the edge of the under bump metallization pad UBM.

In some embodiments, the footing seed layer is merely provided for an ultra-high density (UHD) layer. In some embodiments, the lowest redistribution layer (including the metal line M1 and the via V1) adjacent to the die 10 is provided with a footing seed layer, while the upper redistribution layers (including the metal lines M1 to M3 and the vias V1 to V3) are provided without footing seed layers. Specifically, the edge of the seed layer structure SLS1 is protruded out from the edge of the lowest redistribution layer, while the edges of the seed layer structures SLS2-SLS3 are aligned with the upper redistribution layers.

The method of forming the redistribution layer structure of the semiconductor package in FIG. 1 or FIG. 2 is locally illustrated in FIGS. 3A to 3F in the following.

Figure 3A:
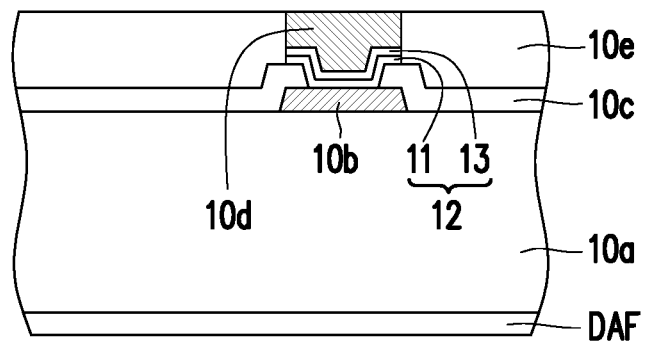
FIGS. 3A to 3F are cross-sectional views showing a method of forming a conductive structure of a semiconductor package in accordance with some embodiments.

Referring to FIG. 3A, at least one die 10 is placed on a carrier (not shown). The die 10 has a substrate 10a, at least one pad 10b over the substrate 10a, a passivation layer 10c over the substrate 10a, at least one connector 10d over the passivation layer 10c and electrically connected to the pad 10b, a seed layer structure 12 between the connector 10d and the pad 10b, and a protection layer 10e over the passivation layer 10c and aside the connector 10d. In some embodiment, a die attach film DAF is provided on the backside of the die 10 and attached to the carrier.

Figure 3B:
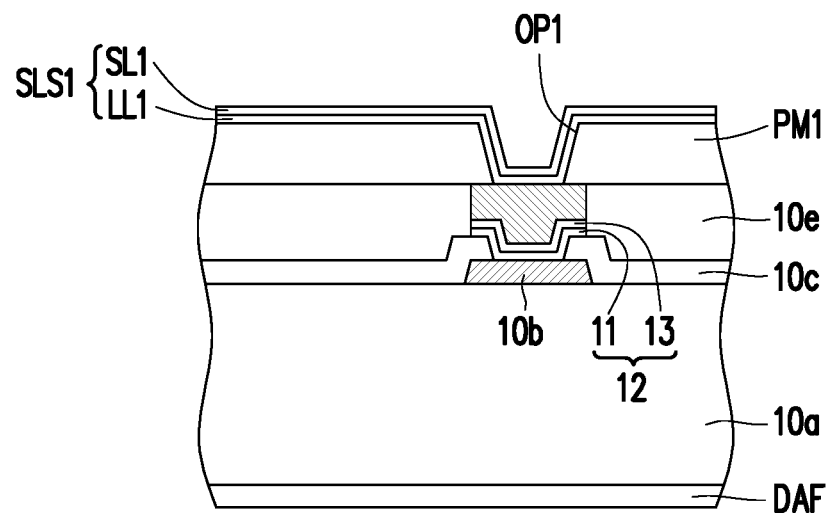

Referring to FIG. 3B, a polymer layer PM1 is formed over the connector 10d and the protection layer 10e. In some embodiments, the polymer layer PM1 has at least one opening OP1 that exposes the intended location for the subsequently formed via V1. The opening for the at least one via V1 exposes the corresponding connector 10d of the die 10.

Thereafter, a seed layer structure SLS1 is formed over the polymer layer PM1 along the surface of the opening OP1. In some embodiments, the seed layer structure SLS1 includes a lining layer LL1 and a seed layer SL1, and is formed by a sputtering or a suitable method. In some embodiments, the lining layer LL1 may include Ti, and the seed layer SL1 may include Cu.

Figure 3C:
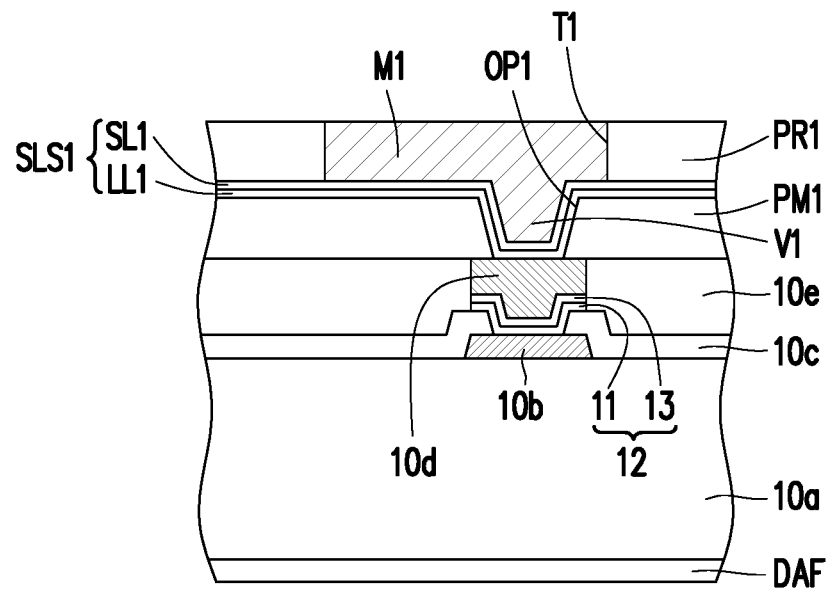

Referring to FIG. 3C, a photoresist layer PR1 is formed on the seed layer structure SLS1. In some embodiments, the photoresist layer PR1 is a dry film resist (DFR) over the die 10 and has at least one trench T1 that exposes the intended location for the subsequently formed metal line M1. The trench T for the subsequently formed metal line M1 is connected to the opening OP1 for the subsequently formed via V1.

Afterwards, a via V1 is formed in the opening OP1 of the polymer layer PM1 and a metal line M1 is formed in the trench T1 of the photoresist layer PR1. In some embodiments, the method of forming the via V1 and the metal line M1 includes performing a plating process. In some embodiments, the via V1 and the metal line M1 are plated in the opening OP1 and the trench T1 by using the seed layer structure SLS1 as a seed. In some embodiments, the via V1 and the metal line M1 may include Cu.

Figure 3D:
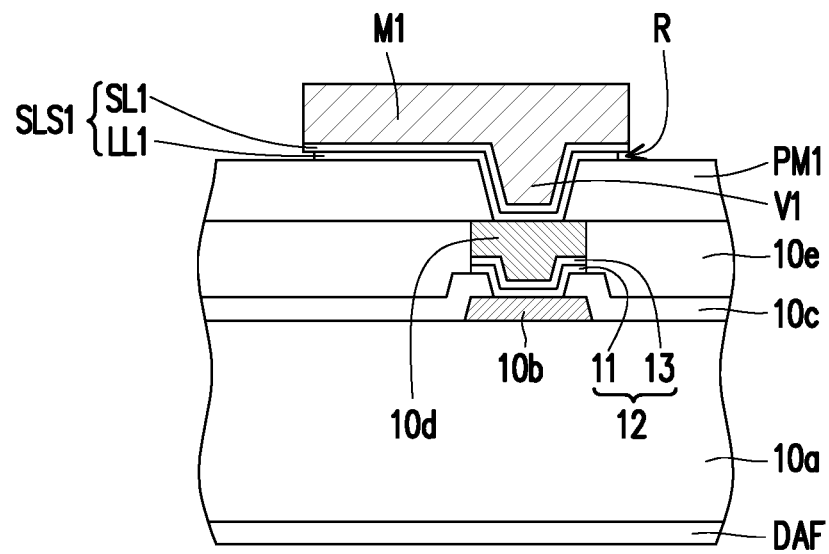

Referring to FIG. 3D, the photoresist layer PR1 and the underlying seed layer structure SLS1 are removed. In some embodiments, the photoresist layer PR1 is removed, and then the seed layer structure SLS1 is partially removed by using the metal line M1 as a mask. Therefore, the remaining seed layer structure SLS1 is between the metal line M1 and the polymer layer PM1, the via V1 and the polymer layer PM1 and between the via V1 and the corresponding connector 10d. In some embodiments, the remaining seed layer structure SLS1 may form an undercut or recess R between the metal line M1 and the polymer layer PM1. In some embodiments, the lining layer LL1 is recessed inwardly with respect to the edge of the metal line M1. In some embodiments, upon the removal operation of FIG. 3D, the projecting width of the metal line M1 on the polymer layer PM1 is substantially the same as the projecting width of the seed layer SL1 on the polymer layer PM1 but greater than the projecting width of the lining layer LL1 on the polymer layer PM1.

Figure 3E:
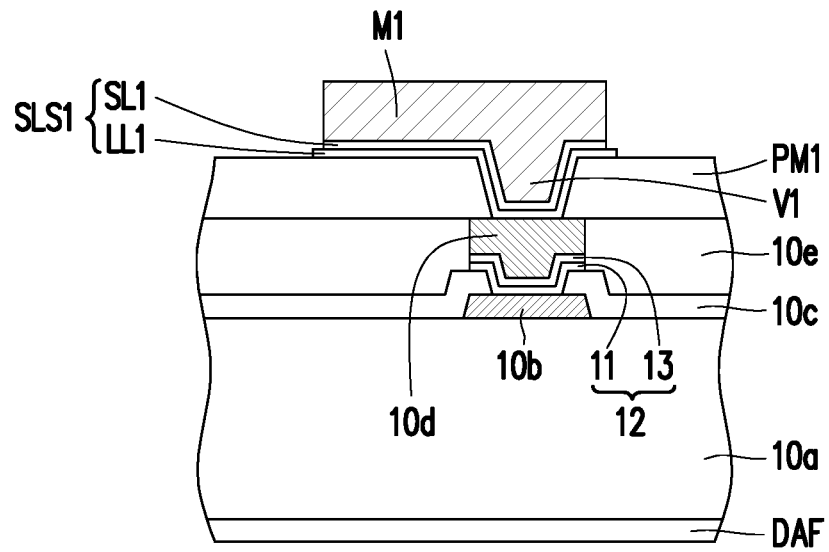

Referring to FIG. 3E, the metal line M1 and the upper portion of the seed layer structure SLS1 are trimmed. In some embodiments, the trimming operation includes an etching such as a wet etching. In some embodiments, the trimming operation includes trimming the metal line M1 and the seed layer SL1 without trimming the lining layer LL1. Specifically, the lining layer LL1 has substantially the same thickness after the trimming operation, but the disclosure is not limited thereto. In alternative embodiments, the trimming operation may partially remove the lining layer LL1, such that the lining layer LL1 may be thicker in the center portion but thinner in the edge portion after the trimming operation.

In some embodiments, the trimming operation is performed by an isotropic wet etching. The etching solution may include a mixture of dilute phosphoric acid, sulfuric acid (about 0.1 to 10%) and hydrogen peroxide (about 0.1 to 10%). The process temperature may range from about 20° C. to 45° C.

After the trimming operation, the lower portion (e.g., lining layer LL1) of the seed layer structure SLS1 is protruded from the edge of the trimmed metal line M1. Specifically, the lower portion (e.g., lining layer LL1) of the seed layer structure functions as a footing for the metal feature (e.g., metal line M1), and is referred to a footing seed layer in some examples. In some embodiments, upon the trimming operation of FIG. 3E, the projecting width of the trimmed metal line M1 is substantially the same as the projecting width of the seed layer SL1 but smaller than the projecting width of the lining layer LL1. The footing seed layer is beneficial to enhance the interface adhesion between the metal and the adjacent polymer material, reduce the metal from diffusing to the underlying device and therefore stabilize the impedance during reliability test.

Figure 3F:
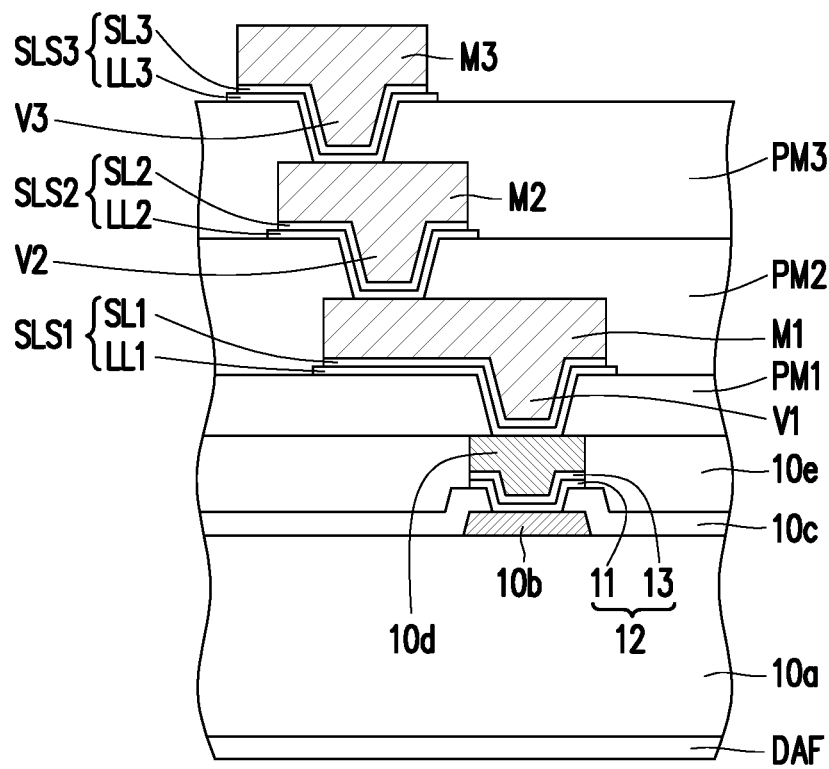

Referring to FIG. 3F, the operations similar to those in FIG. 3B to FIG. 3E are performed, so as to form a via V2 electrically connected to the metal line M1, a metal line M2 electrically connected to the via V2, a via V3 electrically connected to the metal line M2, and a metal line M3 electrically connected to the via V3. A redistribution layer structure of this embodiment is thus completed.

Figure 4:
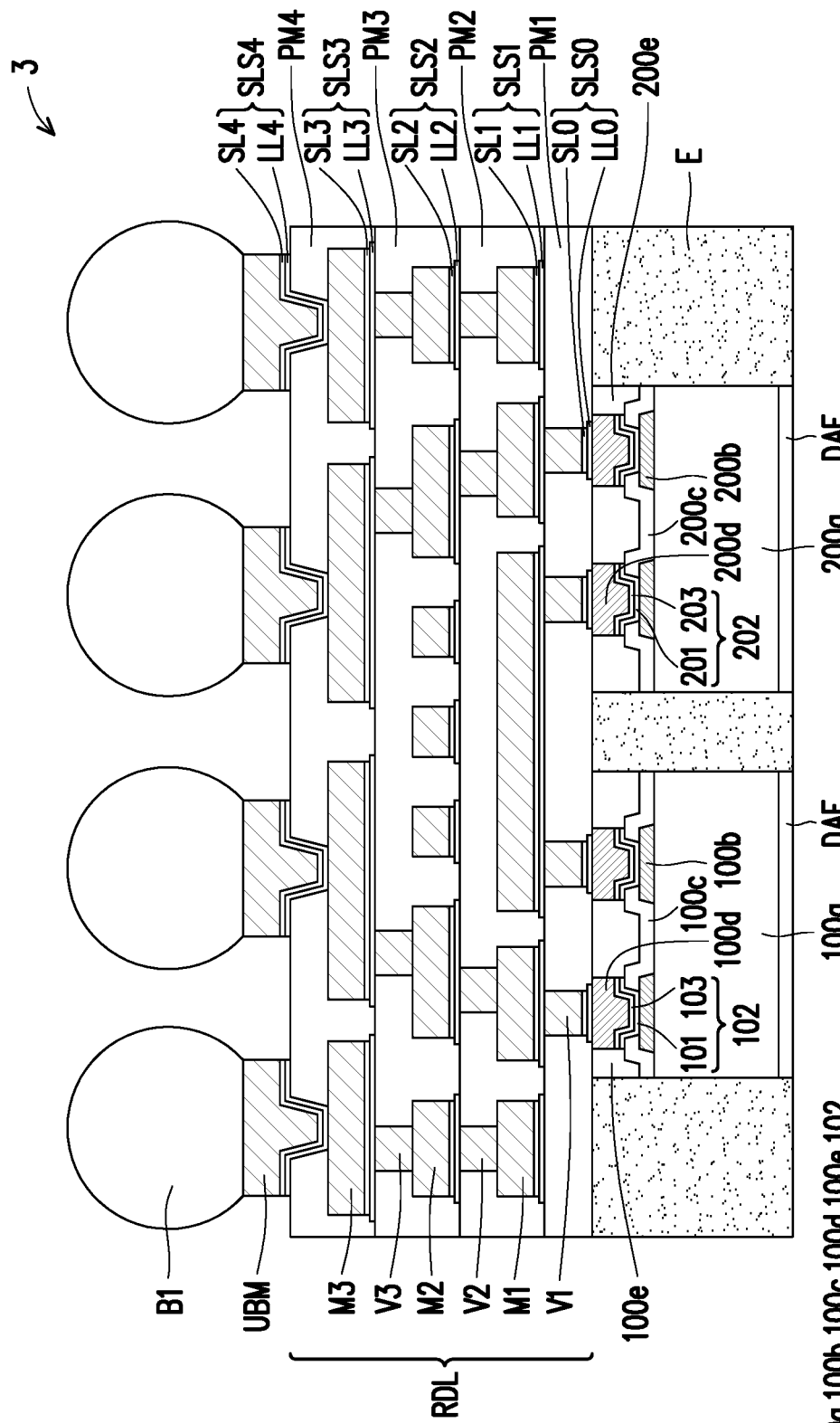
FIG. 4 is a cross-section view of a semiconductor package in accordance with alternative embodiments.
Figure 5:
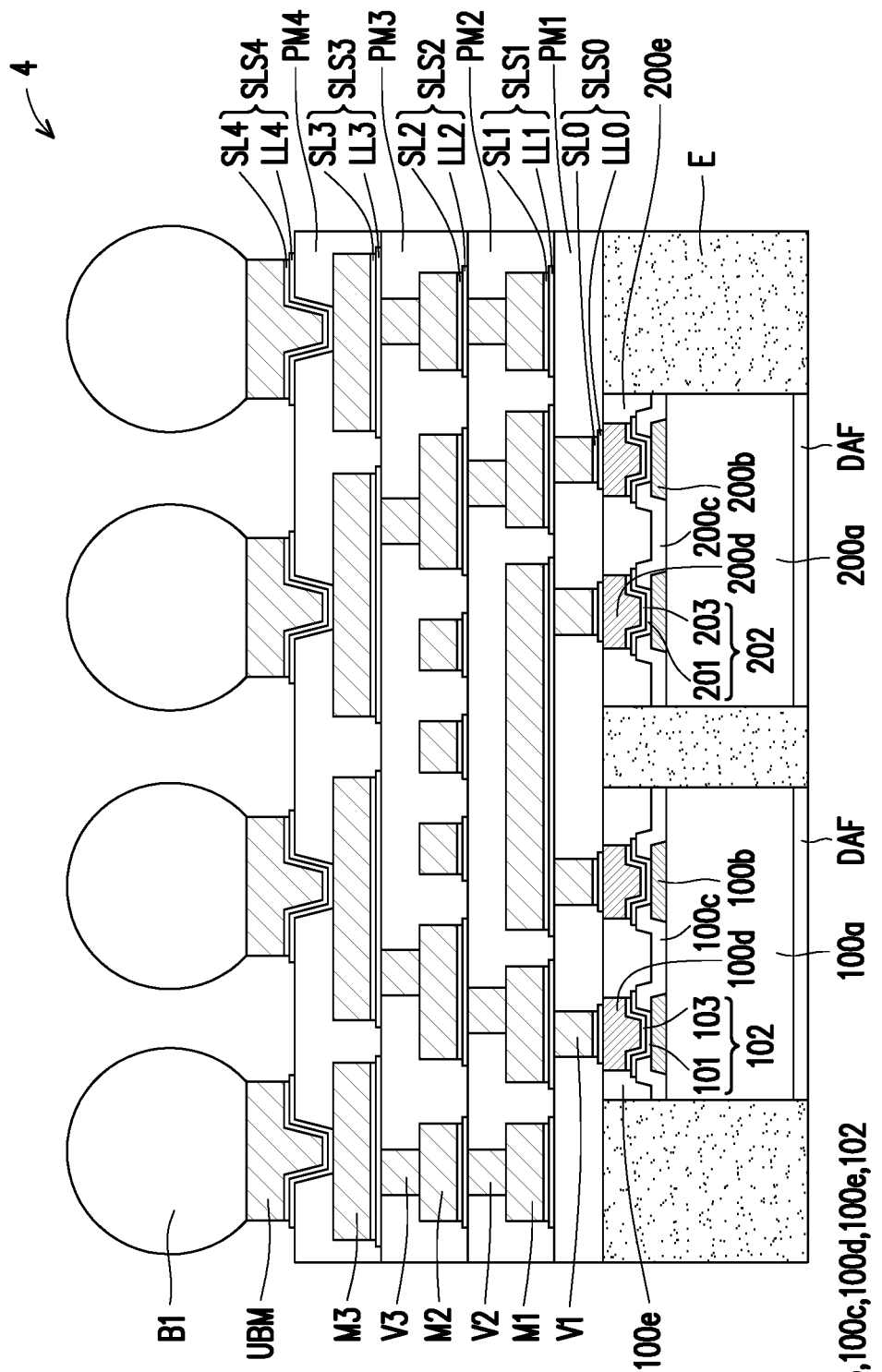
FIG. 5 is a cross-section view of a semiconductor package in accordance with alternative embodiments.

FIG. 4 is a cross-section view of a semiconductor package in accordance with alternative embodiments. FIG. 5 is a cross-section view of a semiconductor package in accordance with alternative embodiments. FIGS. 6A to 6I are cross-sectional views of a method of forming a conductive structure of a semiconductor package in accordance with alternative embodiments. In some embodiments, the semiconductor package of FIG. 4 or FIG. 5 is an integrated fan-out (InFO) package, and the conductive structure is a redistribution layer structure, but the disclosure is not limited thereto. The disclosure may be applied to an integrated fan-in package as needed.

Referring to FIG. 4, a semiconductor package 3 including two dies 100 and 200 is provided. Each of the dies 100 and 200 may be an application-specific integrated circuit (ASIC) chip, an analog chip, a sensor chip, a wireless and radio frequency chip, a voltage regulator chip or a memory chip, for example. In some embodiments, each of the dies 100 and 200 may include an active component or a passive component. In some embodiments, the die 100 and the die 200 may have similar function or size. In alternative embodiments, the die 100 and the die 200 may have different functions or sizes.

In some embodiments, the die 100 includes a substrate 100a, at least one pad 100b over the substrate 100a, a passivation layer 100c over the substrate 100a and exposing a portion of the pad 100b, at least one connector 100d over the passivation layer 100c and electrically connected to the pad 100b, and a protection layer 100e over the passivation layer 100c and aside the at least one connector 100d. The substrate 100a may include bulk silicon, doped or undoped, or an active layer of a semiconductor-on-insulator (SOI) substrate. The substrate 100a may have a device layer that includes a gate, source/drain regions, an interconnection structure, etc. The pads 100b may be electrically connected to the device layer and may include aluminum. Each of the passivation layer 100c and the protection layer 100e may include a dielectric material such as silicon oxide, silicon nitride or silicon oxynitirde, a polymer material such as polybenzoxazole (PBO), polyimide (PI) or benzocyclobutene (BCB), or the like. The passivation layer 100c may include a material different from that of the protection layer 100e.

In some embodiments, the die 100 further includes a seed layer structure 102 between the connector 100d and the corresponding pad 100b. In some embodiments, the seed layer structure 102 is a multi-layer structure including a lining layer 101 and an overlying seed layer 103. The lining layer 101 is configured to enhance the adhesion between each connector 100d and the underlying pad 100d, and is referred to as an adhesion layer in some examples. The lining layer 101 may serve as a barrier layer to prevent the diffusion of a metal into the underlying material, and is referred to as a barrier layer in some examples. The lining layer 101 is a part of the seed layer structure 102, and is referred to a seed layer in some examples. In some embodiments, each of the lining layer 101, the seed layer 103 and the connector 100d includes Ti, Ta, Cu, W, Ru, Co, Ni or an alloy thereof. In some embodiments, the seed layer 103 may include a material different from that of the lining layer 101, but may include a material the same as that of the connector 100d. In some embodiments, the side of the die 100 with the connector 100d is referred to as a front side throughout the description. In some embodiments, a die attach film DAF is provided on the backside of the die 100.

In some embodiments, the die 200 has a structure similar to that of the die 100. For example, the die 200 includes a substrate 200a, at least one pad 200b, a passivation layer 200c, at least one connector 200d and a protection layer 200e, but the disclosure is not limited thereto. In some embodiments, the die 200 further includes a seed layer structure 202 between the connector 200d and the corresponding pad 200b. In some embodiments, the seed layer structure 202 is a multi-layer structure including a lining layer 201 and an overlying seed layer 203. In some embodiments, the materials and dispositions of components of the die 200 are similar to those of the die 100, so the details are not iterated herein.

In some embodiments, an encapsulant E is further included in the semiconductor package 3. The encapsulant E is disposed aside and between the dies 100 and 200. The encapsulant E surrounds the dies 100 and 200, and exposes the surface of the connector 100d. The encapsulant E includes a molding compound such as epoxy, a photosensitive material such as polybenzoxazole (PBO), polyimide (PI) or benzocyclobutene (BCB), a combination thereof or the like. In some embodiments, through integrated fan-out vias TIV (not shown) are formed through the encapsulant E for providing electrical connection between the die(s) and other metal features.

In some embodiments, at least one via V1 is further included in the semiconductor package 3. The vias V1 are disposed over and electrically connected to the dies 100 and 200. Specifically, the vias V1 are electrically connected to the connectors 100d and 200d of the dies 100 and 200.

In some embodiments, a seed layer structure SLS0 is disposed between each via V1 and the corresponding connector 100d or 200d. In some embodiments, the seed layer structure SLS0 may include a lining layer LL0 and an overlying seed layer SL0. The lining layer LL0 may be referred to an adhesion layer, a barrier layer or a seed layer in some examples. In some embodiments, each of the lining layer LL0, the seed layer SL0 and the at least one via V1 includes Ti, Ta, Cu, W, Ru, Co, Ni or an alloy thereof. In some embodiments, the seed layer SL0 may include a material different from that of the lining layer LL0, but may include a material the same as that of the at least one via V1. For example, the lining layer LL0 may include Ti, and the seed layer SL0 and the at least one via V1 may include Cu.

In some embodiments, a polymer layer PM1 is further included in the semiconductor package 3. In some embodiments, the polymer layer PM1 is disposed over the dies 100 and 200 and the encapsulant E and surrounds the at least one via V1. In some embodiments, the polymer layer PM1 includes polybenzoxazole (PBO), polyimide (PI), benzocyclobutene (BCB), a combination thereof or the like.

In some embodiments, the edge of the seed layer structure SLS0 is protruded from the edge of each via V1. In some embodiments, the edge of the lining layer LL0 is protruded from the edge of the via V1, while the edge of the seed layer SL0 is aligned with the edge of the via V1. In some embodiments, the protruding edge of the seed layer structure SLS0 is encapsulated by the adjacent polymer layer PM1.

From another point of view, the lower portion (e.g., lining layer SL0) of the seed layer structure functions as a footing for the metal feature (e.g., via V1), and is referred to a footing seed layer in some examples. The footing seed layer is beneficial to enhance the interface adhesion between the metal and the adjacent polymer material, reduce the metal from diffusing to the underlying device and therefore stabilize the impedance during reliability test.

In some embodiments, a metal line M1 is further included in the semiconductor package 3. The metal line M1 is disposed over and electrically connected to the dies 100 and 200 through the vias V1. In some embodiments, the metal line M1 is called an ultra-high density (UHD) layer.

In some embodiments, a seed layer structure SLS1 is disposed between the metal line M1 and the corresponding via V1 and between the metal line M1 and the polymer layer PM1. In some embodiments, the seed layer structure SLS1 may include a lining layer LL1 and an overlying seed layer SL1. The lining layer LL1 may be referred to an adhesion layer, a barrier layer or a seed layer in some examples. In some embodiments, each of the lining layer LL1, the seed layer SL1 and the metal line M1 includes Ti, Ta, Cu, W, Ru, Co, Ni or an alloy thereof. In some embodiments, the seed layer SL1 may include a material different from that of the lining layer LL1, but may include a material the same as that of the metal line M1. For example, the lining layer LL1 may include Ti, and the seed layer SL1 and the metal line M1 may include Cu.

In some embodiments, a polymer layer PM2 is further included in the semiconductor package 3. In some embodiments, the polymer layer PM2 is disposed over the polymer layer PM1 and surrounds the metal line M1 and the at least one via V2. In some embodiments, the polymer layer PM2 includes polybenzoxazole (PBO), polyimide (PI), benzocyclobutene (BCB), a combination thereof or the like.

In some embodiments, the edge of the seed layer structure SLS1 is protruded from the edge of the metal line M1. In some embodiments, the edge of the lining layer LL1 is protruded from the edge of the metal line M1, while the edge of the seed layer SL1 is aligned with the edge of the metal line M1. In some embodiments, the protruding edge of the seed layer structure SLS1 is encapsulated by the adjacent polymer layer PM2.

In some embodiments, the at least one via V2 is further included in the semiconductor package 3. In some embodiments, the at least one via V2 includes Ti, Ta, Cu, W, Ru, Co, Ni or an alloy thereof. The at least one via V2 is disposed over and electrically connected to the metal line M1. In some embodiments, the at least one via V2 is in physical contact with the metal line M1 without a seed layer structure therebetween.

In some embodiments, a metal line M2 is further included in the semiconductor package 3. The metal line M2 is disposed over the polymer layer PM2 and electrically connected to the metal line M1 through the at least one via V2. In some embodiments, the metal line M2 is called an ultra-high density (UHD) layer.

In some embodiments, a seed layer structure SLS2 is disposed between the metal line M2 and the corresponding via V2 and between the metal line M2 and the polymer layer PM2. In some embodiments, the seed layer structure SLS2 may include a lining layer LL2 and an overlying seed layer SL2. The lining layer LL2 may be referred to an adhesion layer, a barrier layer or a seed layer in some examples. In some embodiments, each of the lining layer LL2, the seed layer SL2 and the metal line M2 includes Ti, Ta, Cu, W, Ru, Co, Ni or an alloy thereof. In some embodiments, the seed layer SL2 may include a material different from that of the lining layer LL2, but may include a material the same as that of the metal line M2. For example, the lining layer LL2 may include Ti, and the seed layer SL2 and the metal line M2 may include Cu.

In some embodiments, a polymer layer PM3 is further included in the semiconductor package 3. In some embodiments, the polymer layer PM3 is disposed over the polymer layer PM2 and surrounds the metal line M2 and the at least one via V3. In some embodiments, the polymer layer PM3 includes polybenzoxazole (PBO), polyimide (PI), benzocyclobutene (BCB), a combination thereof or the like.

In some embodiments, the edge of the seed layer structure SLS2 is protruded from the edge of the metal line M2. In some embodiments, the edge of the lining layer LL2 is protruded from the edge of the metal line M2, while the edge of the seed layer SL2 is aligned with the edge of the metal line M2. In some embodiments, the protruding edge of the seed layer structure SLS2 is encapsulated by the adjacent polymer layer PM3.

In some embodiments, at least one via V3 is further included in the semiconductor package 3. In some embodiments, the at least one via V3 includes Ti, Ta, Cu, W, Ru, Co, Ni or an alloy thereof. The at least one via V3 is disposed over and electrically connected to the metal line M2. In some embodiments, the at least one via V3 is in physical contact with the metal line M2 without a seed layer structure therebetween.

In some embodiments, a metal line M3 is further included in the semiconductor package 3. The metal line M3 is disposed over the polymer layer M3 and electrically connected to the metal line M2 through the at least one via V3.

In some embodiments, a seed layer structure SLS3 is disposed between the metal line M3 and the corresponding via V3 and between the metal line M3 and the polymer layer PM3. In some embodiments, the seed layer structure SLS3 may include a lining layer LL3 and an overlying seed layer SL3. The lining layer LL3 may be referred to an adhesion layer, a barrier layer or a seed layer in some examples. In some embodiments, each of the lining layer LL3, the seed layer SL3 and the metal line M3 includes Ti, Ta, Cu, W, Ru, Co, Ni or an alloy thereof. In some embodiments, the seed layer SL3 may include a material different from that of the lining layer LL3, but may include a material the same as that of the metal line M3. For example, the lining layer LL3 may include Ti, and the seed layer SL3 and the metal line M3 may include Cu.

In some embodiments, a polymer layer PM4 is further included in the semiconductor package 3. In some embodiments, the polymer layer PM4 is disposed over the polymer layer PM3 aside the metal line M3 and exposes a part of the metal line M3. In some embodiments, the polymer layer PM4 includes polybenzoxazole (PBO), polyimide (PI), benzocyclobutene (BCB), a combination thereof or the like.

In some embodiments, the edge of the seed layer structure SLS3 is protruded from the edge of the metal line M3. In some embodiments, the edge of the lining layer LL3 is protruded from the edge of the metal line M3, while the edge of the seed layer SL3 is aligned with the edge of the metal line M3. In some embodiments, the protruding edge of the seed layer structure SLS3 is encapsulated by the adjacent polymer layer PM4.

In some embodiments, under bump metallization pads UBM are further included in the semiconductor package 3. The under bump metallization pads UBM are disposed over and electrically connected to the metal line M3.

In some embodiments, a seed layer structure SLS4 is disposed between the under bump metallization pad UBM and the polymer layer PM4 and between the under bump metallization pad UBM and the metal line M3. In some embodiments, the seed layer structure SLS4 may include a lining layer LL4 and an overlying seed layer SL4. The lining layer LL4 may be referred to an adhesion layer, a barrier layer or a seed layer in some examples. In some embodiments, each of the lining layer LL4, the seed layer SL4 and the under bump metallization pads UBM includes Ti, Ta, Cu, W, Ru, Co, Ni or an alloy thereof. In some embodiments, the seed layer SL4 may include a material different from that of the lining layer LL4, but may include a material the same as that of the under bump metallization pads UBM. For example, the lining layer LL4 may include Ti, and the seed layer SL4 and the under bump metallization pads UBM may include Cu.

A redistribution layer structure RDL of the disclosure is thus completed. In some embodiments, the redistribution layer structure RDL includes the vias V1, V2 and V3, the metal lines M1, M2 and M3, and the seed layer structures SLS0, SLS1, SLS2 and SLS3. In some embodiments, the redistribution layer structure RDL optionally includes the bump metallization pads UBM and the seed layer structure SLS4.

In some embodiments, bumps B1 are further included in the semiconductor package 3. The bumps B1 is disposed over and electrically connected to the under bump metallization pads UBM. In some embodiments, the bumps B1 include copper, solder, nickel or a combination thereof.

In the above embodiments, a via or a metal line is provided with a footing seed layer while a connector or bump is provided without a footing seed layer, as shown in FIG. 4. However, the present disclosure is not limited thereto. In alternative embodiments, a connector or bump may be provided with a footing seed layer, as shown in FIG. 5. For example, the edge of the lining layer 101/201 of the seed layer structure 102/202 is protruded out from the edge of the connector 100d/200d, and/or the edge of the lining layer LL4 of the seed layer structure SLS4 is protruded out from the edge of the under bump metallization pad UBM.

The method of forming the redistribution layer structure of the semiconductor package in FIG. 4 or FIG. 5 is locally illustrated in FIGS. 6A to 6I in the following.

Figure 6A:
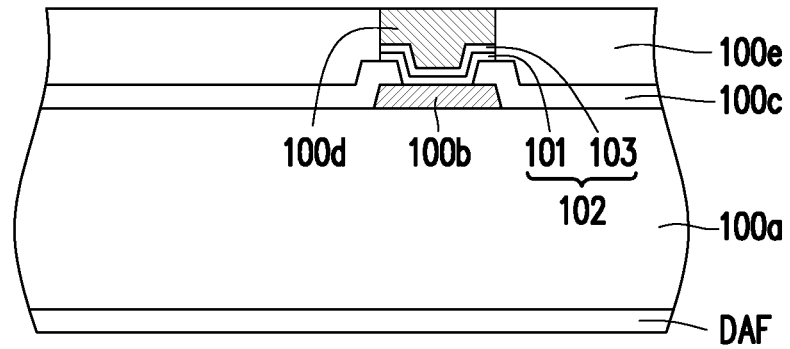
FIGS. 6A to 6I are cross-sectional views showing a method of forming a conductive structure of a semiconductor package in accordance with alternative embodiments.

Referring to FIG. 6A, at least one die 100 is placed on a carrier (not shown). The die 100 has a substrate 100a, at least one pad 100b over the substrate 100a, a passivation layer 100c over the substrate 100a, at least one connector 100d over the passivation layer 100c and electrically connected to the pad 100b, a seed layer structure 102 between the connector 100d and the pad 100b, and a protection layer 100e over the passivation layer 100c and aside the connector 100d. In some embodiment, a die attach film DAF is provided on the backside of the die 100 and attached to the carrier.

Figure 6B:
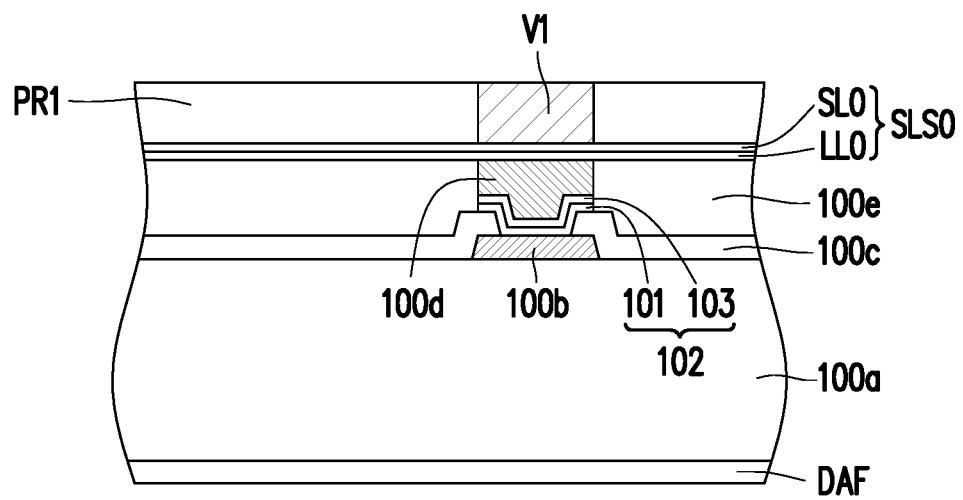

Referring to FIG. 6B, a seed layer structure SLS0 is formed over the connector 100d and the protection layer 100e. In some embodiments, the seed layer structure SLS0 includes a lining layer LL0 and a seed layer SL0, and is formed by a sputtering or a suitable method. In some embodiments, the lining layer LL0 may include Ti, and the seed layer SL0 may include Cu.

Thereafter, a photoresist layer PR1 is formed on the seed layer structure SLS0. In some embodiments, the photoresist layer PR1 is a dry film resist (DFR) over the die 100 and has at least one opening that exposes the intended location for the subsequently formed via V1. The opening for the at least one via V1 exposes the corresponding connector 100d of the die 100.

Afterwards, the via V1 is formed in the opening of the photoresist layer PR1. In some embodiments, the method of forming the via V1 includes performing a plating process. In some embodiments, the via V1 is plated in the opening of the photoresist layer PR1 by using the seed layer structure SLS0 as a seed. In some embodiments, the via V1 may include Cu.

Figure 6C:
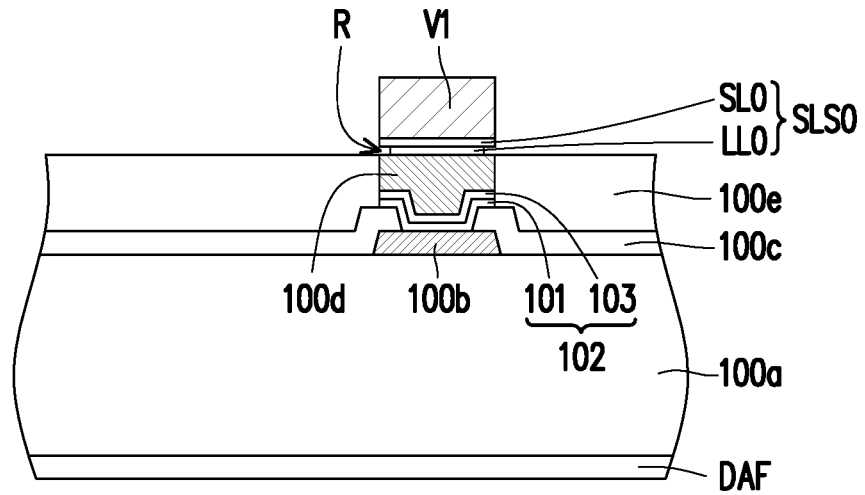

Referring to FIG. 6C, the photoresist layer PR1 and the underlying seed layer structure SLS0 are removed. In some embodiments, the photoresist layer PR1 is removed, and then the seed layer structure SLS0 is partially removed by using the via V1 as a mask. Therefore, the remaining seed layer structure SLS0 is between the via V1 and the corresponding connector 100*d*. In some embodiments, the remaining seed layer structure SLS0 may form an undercut or recess R between the via V1 and the corresponding connector 100*d*. In some embodiments, the lining layer LL0 is recessed inwardly with respect to the edge of the via V1. In some embodiments, upon the removal operation of FIG. 6C, the width of the via V1 is substantially the same as the width of the seed layer SL0 but greater than the width of the lining layer LL0.

Figure 6D:
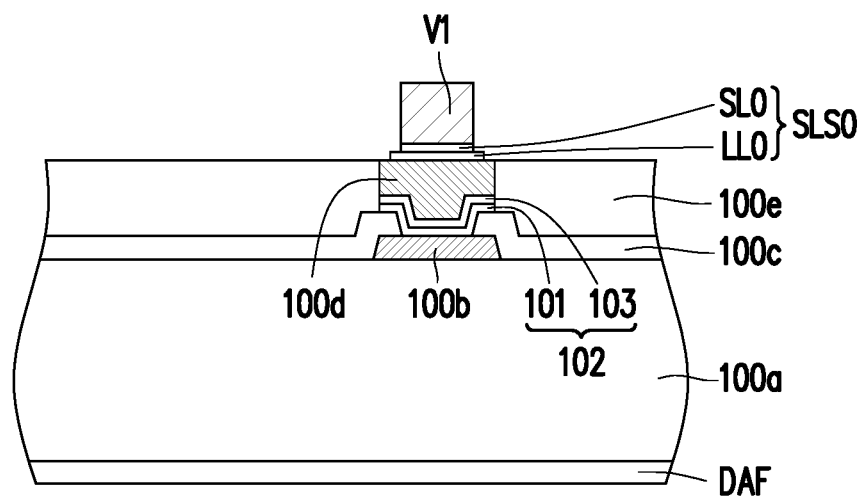

Referring to FIG. 6D, the via V1 and the upper portion of the seed layer structure SLS0 are trimmed. In some embodiments, the trimming operation includes an etching such as a wet etching. In some embodiments, the trimming operation includes trimming the via V1 and the seed layer SL0 without trimming the lining layer LL0. In some embodiments, upon the trimming operation of FIG. 6D, the width of the trimmed via V1 is substantially the same as the width of the seed layer SL0 but smaller than the width of the lining layer LL0.

Figure 6E:
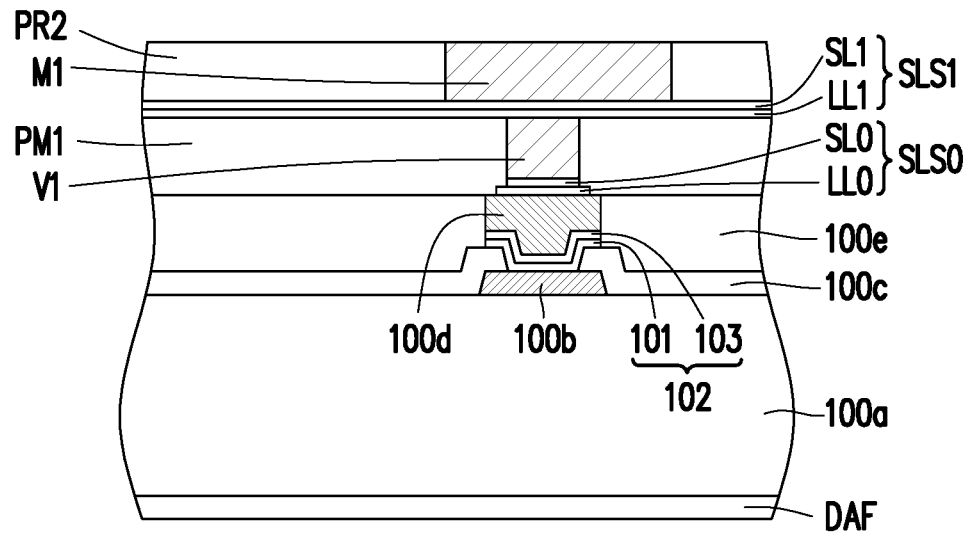

Referring to FIG. 6E, a polymer layer PM1 is formed over the connector 100*d* and the protection layer 100*e* and aside the via V1. The top surface of the polymer layer PM1 is substantially coplanar with top surface of the via V1. In some embodiments, the polymer layer PM1 covers the protruding edge of the seed layer structure SLS0.

Thereafter, a seed layer structure SLS1 is formed on the entire surface of the polymer layer PM1 and in physical contact with the top surface of the via V1. In some embodiments, the seed layer structure SLS1 includes a lining layer LL1 and a seed layer SL1, and is formed by a sputtering or a suitable method. In some embodiments, the lining layer LL1 may include Ti, and the seed layer SL1 may include Cu.

Afterwards, a photoresist layer PR2 is formed on the seed layer structure SLS1. In some embodiments, the photoresist layer PR2 is a dry film resist (DFR) over the polymer layer PM1 and has at least one opening that exposes the intended location for the subsequently formed metal line M1. Afterwards, a plating process is performed to form the metal line M1 (e.g., a copper layer) in the opening of the photoresist layer PR2 by using the seed layer structure SLS1 as a seed.

Figure 6F:
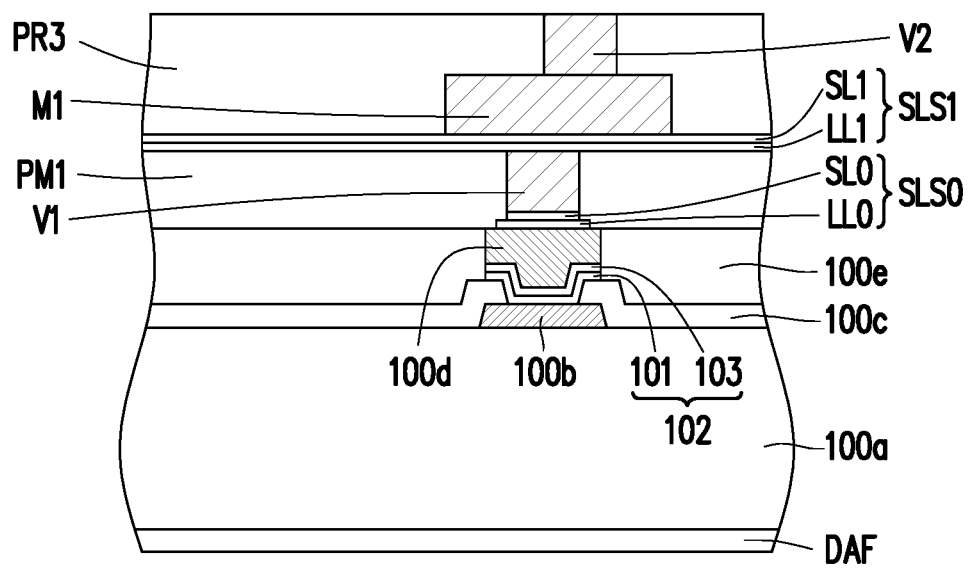

Referring to FIG. 6F, the photoresist layer PR2 is removed. In some embodiments, the photoresist layer PR2 is removed without removing the underlying seed layer structure SLS1.

Thereafter, a photoresist layer PR3 is formed on the seed layer structure SLS1 and the metal line M1. In some embodiments, the photoresist layer PR3 is a dry film resist (DFR) over the polymer layer PM1 and has at least one opening that exposes the intended location for the subsequently formed via V2.

Afterwards, a via V2 is formed in the opening of the photoresist layer PR3. The via V2 may include Cu. In some embodiments, a plating process is performed to form the via V2 by using the metal line M1 as a seed. The via V2 is formed directly on the metal line M1 without a seed layer (e.g., a titanium layer) therebetween.

Figure 6G:
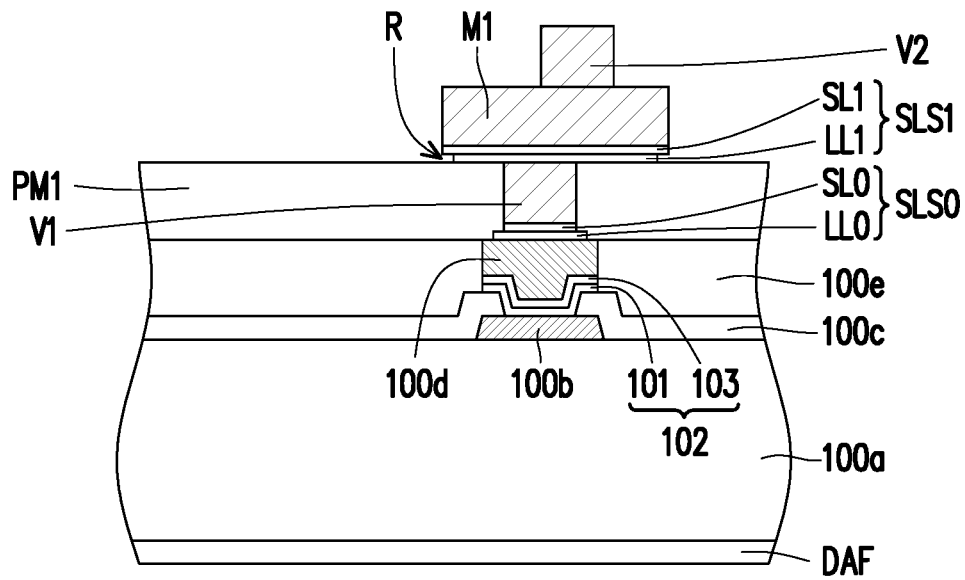

Referring to FIG. 6G, the photoresist layer PR3 and the underlying seed layer structure SLS1 are removed. In some embodiments, the photoresist layer PR3 is removed, and then the seed layer structure SLS1 is partially removed by using the metal line M1 as a mask. Therefore, the remaining seed layer structure SLS1 is between the metal line M1 and the polymer layer PM1. In some embodiments, the remaining seed layer structure SLS1 may form an undercut or recess R between metal line M1 and the polymer layer PM1. In some embodiments, the lining layer LL1 is recessed inwardly with respect to the edge of the metal line M1. In some embodiments, upon the removal operation of FIG. 5C, the width of the metal line M1 is substantially the same as the width of the seed layer SL1 but greater than the width of the lining layer LL1.

Figure 6H:
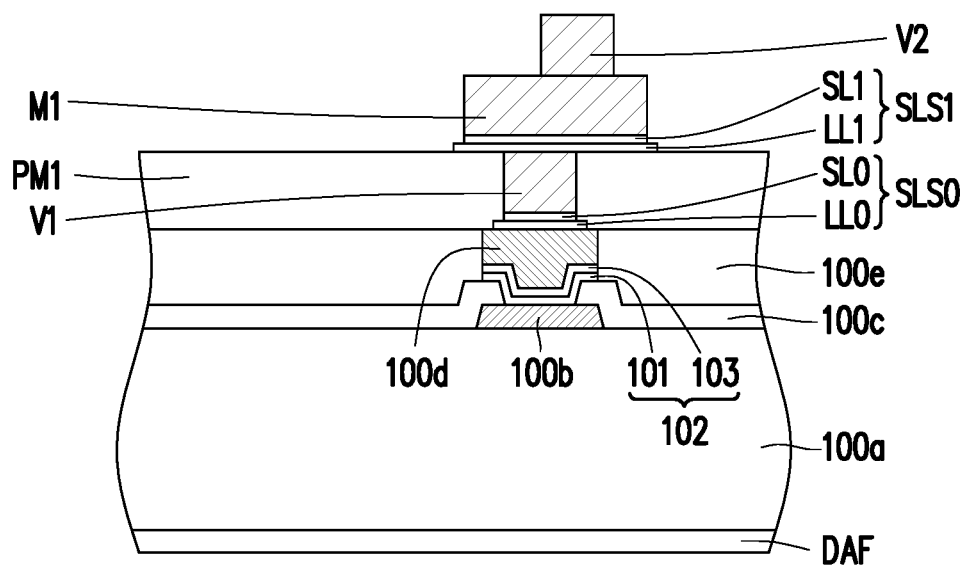

Referring to FIG. 6H, the metal line M1 and the upper portion of the seed layer structure SLS1 are trimmed. In some embodiments, the trimming operation includes an etching such as a wet etching. In some embodiments, the trimming operation includes trimming the metal line M1 and the seed layer SL1 without trimming the lining layer LL1. In some embodiments, upon the trimming operation of FIG. 6H, the width of the trimmed metal line M1 is substantially the same as the width of the seed layer SL1 but smaller than the width of the lining layer LL1.

Figure 6I:
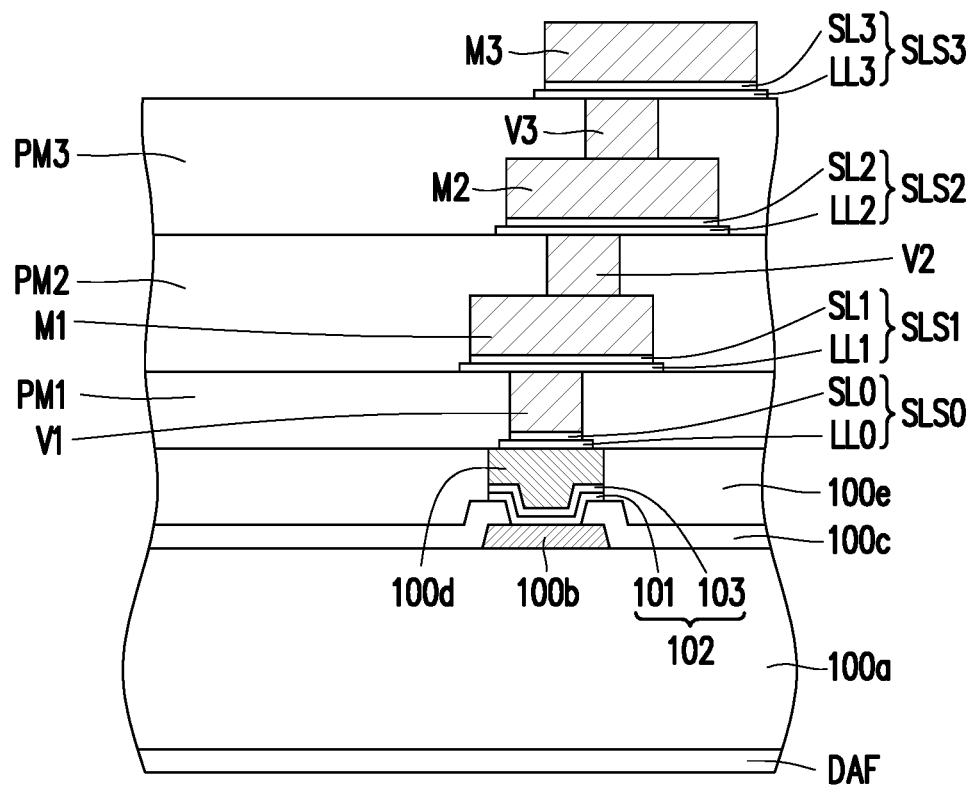

Referring to FIG. 6I, a polymer layer PM2 is formed over the polymer layer PM1, covering the metal line M1 and surrounding the via V2. The top surface of the polymer layer PM2 is substantially coplanar with top surface of the via V2. In some embodiments, the polymer layer PM2 covers the protruding edge of the seed layer structure SLS1.

Thereafter, the operations similar to those in FIG. 6E to FIG. 6H are performed, so as to form a metal line M2 electrically connected to the via V2, a via V3 electrically connected to the metal line M2, a polymer layer PM3 surrounding the metal line M2 and the via V3, and a metal line M3 electrically connected to the via V2. A redistribution layer structure of this embodiment is thus completed.

Figure 7:
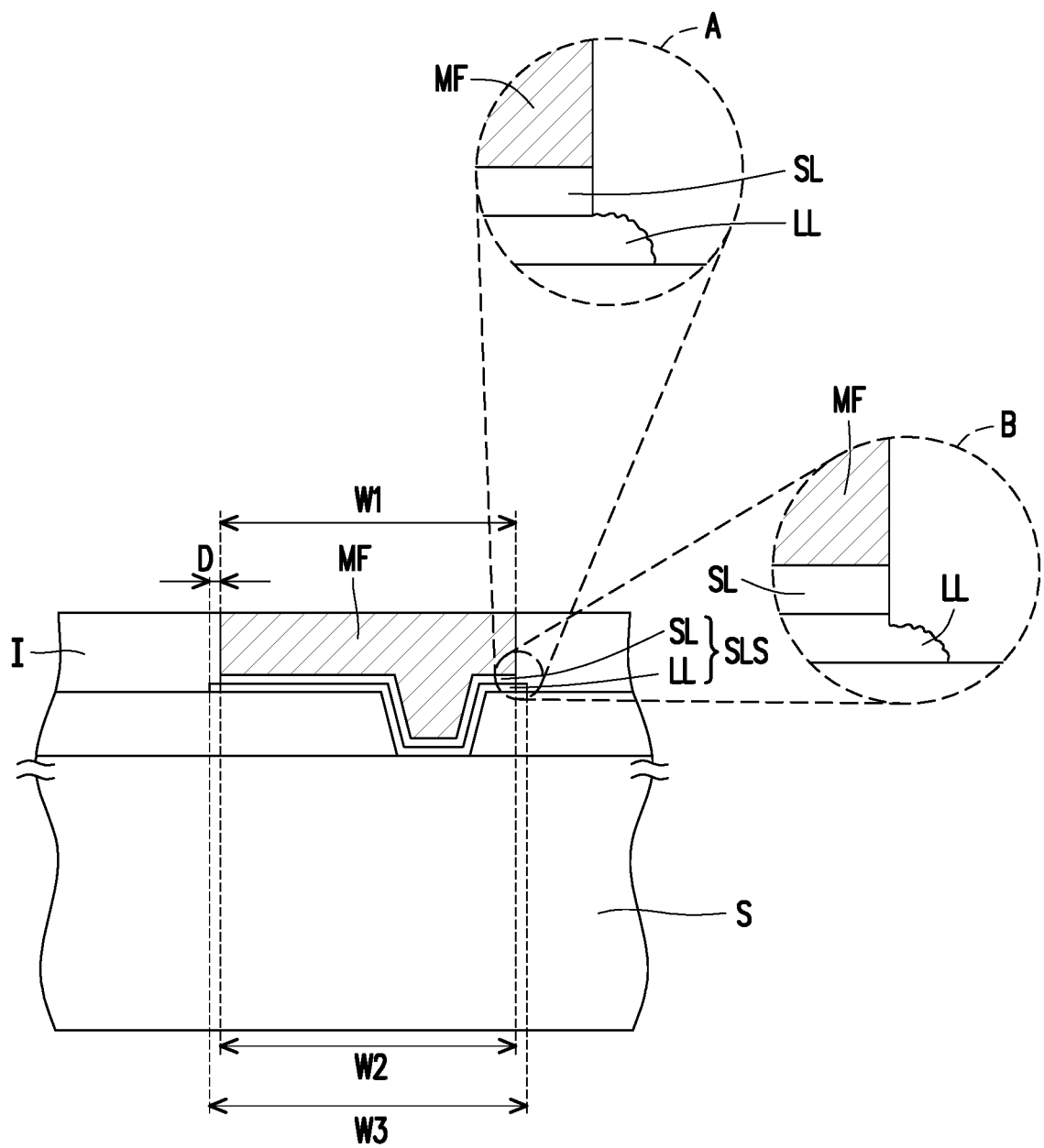
FIG. 7 is a cross-section view of a conductive structure in accordance with some embodiments.
Figure 8:
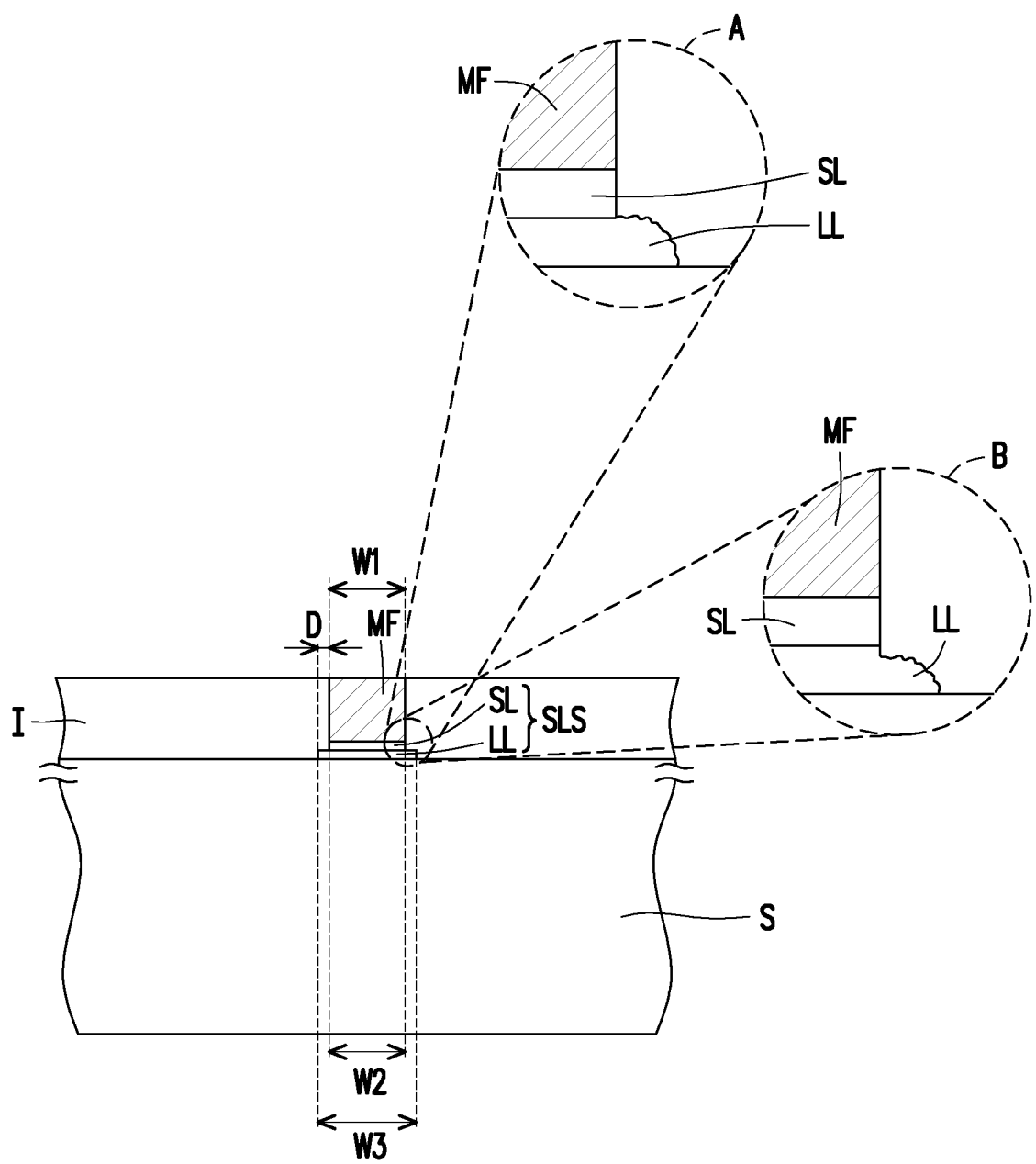
FIG. 8 is a cross-section view of a conductive structure in accordance with alternative embodiments.

FIG. 7 is a cross-section view of a conductive structure in accordance with some embodiments, in which two possible enlarged partial views A and B are shown in the right top corner. FIG. 8 is a cross-section view of a conductive structure in accordance with alternative embodiments, in which two possible enlarged partial views A and B are shown in the right top corner. In some embodiments, the conductive structure of FIG. 7 or FIG. 8 may be applied to the semiconductor packages of FIGS. 1-2 and FIGS. 4-5, but the disclosure is not limited thereto.

In some embodiments, a conductive structure includes a substrate S, a metal feature MF and a seed layer structure SLS. The metal feature MF is disposed over the substrate S. In some embodiments, the substrate S may be a semiconductor substrate or a carrier. In some embodiments, the substrate S may be a polymer layer or a dielectric layer. The seed layer structure SLS is disposed between the metal feature MF and the substrate S. In some embodiments, an edge of the seed layer structure SLS is protruded from an edge of the metal feature MF. In some embodiments, the metal feature MF includes a metal via, a metal line, a metal connector or a metal bump.

In some embodiments, the edge of the seed layer structure SLS protruded from the edge of the metal feature MF is embedded by an insulating layer I. The insulating layer I may be a dielectric layer or a polymer layer. The insulating layer I may be a single-layer or multi-layer structure.

In some embodiments, the seed layer structure SLS has a non-smooth sidewall or a stepped sidewall. In some embodiments, the seed layer structure SLS includes a lining layer LL and a seed layer SL located between the lining layer LL and the metal feature MF. In some embodiments, the lining layer LL and the seed layer SL includes different materials. In some embodiments, an edge of the seed layer SL is aligned with the edge of the metal feature MF, and an edge of the lining layer LL is protruded from the edge of the metal feature MF.

In some embodiments, when the trimming operation is controlled well, the lining layer LL may have substantially the same thickness with a sharp top corner. That is, the average thickness of the protruding edge portion of the lining layer LL is substantially the same as the average thickness of the center portion of the lining layer LL. However, the disclosure is not limited thereto. In some embodiments, the lining layer LL may have an uneven thickness with a rounded top corner.

In some embodiments, the lining layer LL may be thicker in the center portion but thinner in the protruding edge portion. That is, the average thickness of the protruding edge portion of the lining layer LL is less than the average thickness of the center portion of the lining layer LL.

In some embodiments, as shown in the enlarged partial views A and B of FIG. 7 and FIG. 8, the protruding edge portion of the lining layer LL has a taper profile, and the thickness of the protruding edge portion is gradually reduced away from the metal feature MF. In some embodiments, the thickness of the protruding edge portion of the lining layer LL adjacent to the metal feature MF is substantially the same as the thickness of the center portion of the lining layer LL below the metal feature MF, as shown in the enlarged partial views A of FIG. 7 and FIG. 8. In alternative embodiments, the thickness of the protruding edge portion of the lining layer LL adjacent to the metal feature MF is less than the thickness of the center portion of the lining layer LL below the metal feature MF, as shown in the enlarged partial views B of FIG. 7 and FIG. 8

In some embodiments, the top surface of protruding edge portion of the lining layer LL is rougher than the top surface of the center portion of the lining layer LL, as shown in the enlarged partial views A and B of FIG. 7 and FIG. 8. Specifically, the top of the center portion of the lining layer LL below the metal feature MF has a substantially smooth surface, while the top of the protruding edge portion of the lining layer LL outside of the metal feature MF has a rough and uneven surface.

In some embodiments, the top surface of protruding edge portion of the lining layer LL has a surface roughness Rz greater than about 10 nm. Herein, the surface roughness Rz is calculated by measuring the vertical distance from the highest peak to the lowest valley within a predetermined sampling length (e.g., the length of the protruding edge portion of the seed layer structure). In some embodiments, the protruding edge portion is rougher than the central portion of the seed layer structure. In some embodiments, the surface roughness of the protruding edge portion of the seed layer structure is at least two times the surface roughness of the central portion of the seed layer structure. For example, the protruding edge portion of the seed layer structure has a surface roughness Rz greater than about 10 nm, and the central portion of the seed layer structure has a surface roughness less than about 10 nm, 5 nm or 1 nm.

In some embodiments, the metal feature MF has a projecting width of "W1", the seed layer SL has a width of "W2", and the lining layer LL has a width of "W3". Besides, the edge of the seed layer structure SLS is protruded from the edge of the metal feature MF by a distance of "D". The projecting width is defined as a width projected (e.g., vertically projected) on the underlying plane, such as a semiconductor substrate, a carrier, a polymer layer, a dielectric layer or the like. In some embodiments, the ratio of W1 to D ranges from about 3:1 to 1000:1, but the disclosure is not limited thereto. Other ranges are applicable as long as the protruding distance D of the seed layer structure SLS is wide enough to prevent the metal from diffusing to the underlying device. In some embodiments, the protruding distance of the seed layer structure SLS ranges from about 30 nm to 100 nm, but the disclosure is not limited thereto.

In some embodiments, each of the lining layer LL and the seed layer SL has a recess shape in cross section, as shown in FIG. 7. In some embodiments, each of the lining layer LL and the seed layer SL has a horizontal I-shape in cross section, as shown in FIG. 8.

In view of the embodiments of FIGS. 1-2, the embodiments of FIGS. 4-5 in conjunction with the embodiments of FIGS. 7-8, the semiconductor package 1/2/3/4 includes at least one die (e.g., die 10 in FIGS. 1-2, die 100 in FIGS. 4-5) and a redistribution layer structure. The redistribution layer structure (e.g., RDL in FIGS. 1-2 and FIGS. 4-5) is disposed over and electrically to the at least one die and includes at least one metal feature (e.g., M1/M2/M3 in FIGS. 1-2, V1/M1/M2/M3 in FIGS. 4-5) embedded by a polymer layer (e.g., PM2/PM3/PM4 in FIGS. 1-2 and PM1/PM2/PM3/PM4 in FIGS. 4-5). A seed layer structure (e.g., SLS1/SLS2/SLS3 in FIGS. 1-2, SLS0/SLS1/SLS2/SLS3 in FIGS. 4-5) is provided below the metal feature and embedded by the polymer layer, and a projecting width (e.g., the width W3 in FIGS. 7-8) of the seed layer structure is greater than a projection width of the metal feature (e.g., the width W1 in FIGS. 7-8).

Figure 9:
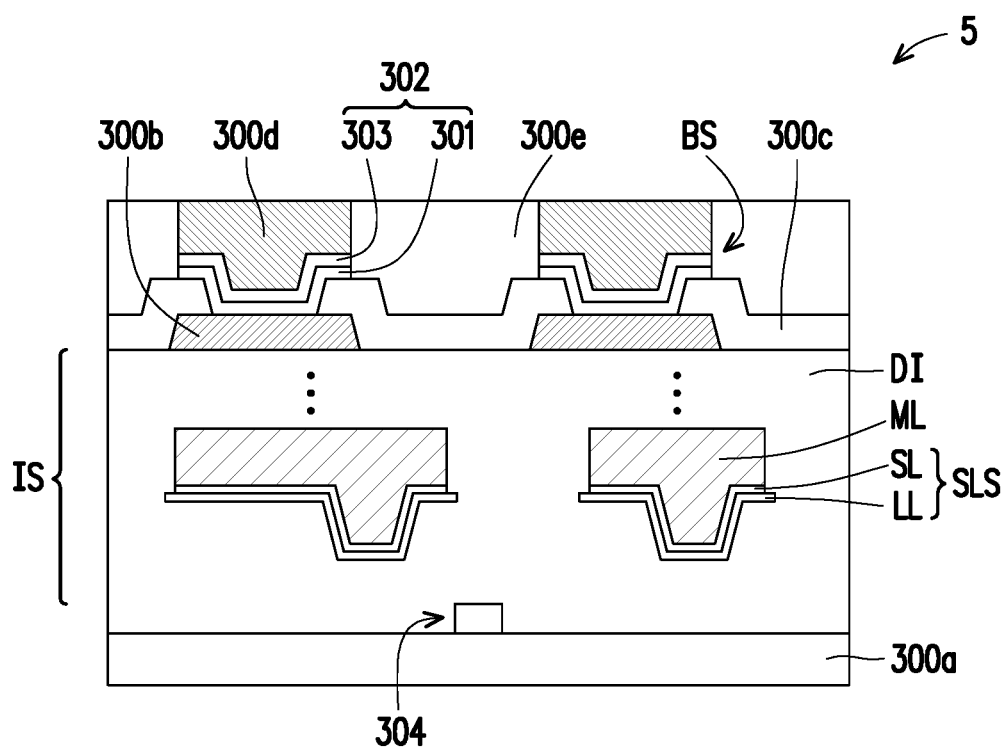
FIG. 9 is a cross-section view of a semiconductor device in accordance with some alternative embodiments.

In some embodiments, the metal feature is a part of a redistribution layer structure of semiconductor package, as shown in FIGS. 1-2 and FIGS. 4-5. However, the disclosure is not limited thereto. In alternative embodiments, the metal feature is a part of an interconnect structure, as show in FIG. 9.

In some embodiments, a semiconductor structure 5 includes a substrate 300a, at least one device 304, an interconnection structure IS and at least one bump structure BS.

The substrate 300a includes isolation structures defining at least one active area, and at least one device 304 is disposed on/in the active area. The device 304 includes one or more functional devices. In some embodiments, the functional devices include active components, passive components, or a combination thereof. In some embodiments, the functional devices may include integrated circuits devices. The functional devices are, for example, transistors, capacitors, resistors, diodes, photodiodes, fuse devices and/or other similar devices.

The interconnection structure IS may be disposed over and electrically to the at least one device 304. In some embodiments, the interconnection structure IS may include at least one metal layer ML embedded by a dielectric layer DI. A seed layer structure SLS is provided below the metal layer ML and embedded by the dielectric layer DI, and a projecting width of the seed layer structure SLS is greater than a projection width of the metal layer ML. The dielectric layer DI may include a high-k material, a low-k material or a combination thereof. The dielectric layer may be a single-layer or multi-layer structure.

The bump structure BS may be electrically connected to the interconnection structure IS. In some embodiments, the bump structure BS includes at least one pad 300b over the substrate 300a, a passivation layer 300c over the substrate 300a and exposing a portion of the pad 300b, at least one connector 300d over the passivation layer 300c and electrically connected to the pad 300b. In some embodiments, a protection layer 300e is over the passivation layer 100c and aside the at least one connector 300d. In some embodiments, the semiconductor device further includes a seed layer structure 302 between the connector 300d and the corresponding pad 300b. In some embodiments, the seed layer structure 302 is a multi-layer structure including a lining layer 301 and an overlying seed layer 303. In some embodiments, the edge of the lining layer 301 may be protruded from the edge of the connector 300d if needed.

The above embodiments in which a seed layer structure is a dual-layer structure are provided for illustration purposes, and are not construed as limiting the present disclosure. In some embodiments, the seed layer structure may include, from bottom to top, a metal lining layer, a metal buffer layer and a metal seed layer. The metal buffer layer may include a material different from that of the metal lining layer or the metal seed layer.

When the redistribution layer is defined by the conventional process, undercuts are usually generated between the metal layer and the underlying polymer layer, and such undercuts may cause voids, delamination and cracks of the redistribution layer after high temperature storage condition. Accordingly, the impedance and therefore the stress and electron migration of the package are increased. However, such issue is not observed in the disclosure.

In the embodiments of the disclosure, the lower portion of the seed layer structure functions as a footing for the metal feature (e.g., metal via, metal line, metal connector or metal bump). The footing seed layer of the disclosure is beneficial to enhance the interface adhesion between the metal and the adjacent polymer material, reduce the metal from diffusing to the underlying device and therefore stabilize the impedance during reliability test.

In accordance with some embodiments of the present disclosure, a semiconductor package includes at least one die and a redistribution layer. The redistribution layer is disposed over and electrically to the at least one die and includes a seed layer structure and a metal feature over the seed layer structure. In some embodiments, an edge of the seed layer structure is protruded from an edge of the metal feature and has a surface roughness Rz greater than 10 nm.

In accordance with alternative embodiments of the present disclosure, a semiconductor package includes at least one die and a redistribution layer structure. The redistribution layer structure is disposed over and electrically to the at least one die and includes at least one metal feature embedded by a polymer layer. A seed layer structure is provided below the metal feature and embedded by the polymer layer, and a projecting width of the seed layer structure is greater than a projection width of the metal feature.

In accordance with yet alternative embodiments of the present disclosure, a method of forming a conductive structure includes the following operations. A seed layer structure is formed over a substrate. A metal feature is formed by using the seed layer structure as a seed. The seed layer structure is partially removed by using the metal feature as a mask. The metal feature and an upper portion of the seed layer structure are trimmed.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   at least one die; and
   a redistribution layer disposed over and electrically to the at least one die and comprising a seed layer structure and a metal feature over the seed layer structure,
   wherein an edge of the seed layer structure is protruded from an edge of the metal feature and has a surface roughness Rz greater than 10 nm.

2. The semiconductor package of claim 1, wherein the edge of the seed layer structure protruded from the edge of the metal feature is embedded by an insulating layer.

3. The semiconductor package of claim 1, wherein the seed layer structure comprises:
   a lining layer; and
   a seed layer located between the lining layer and the metal feature,
   wherein an edge of the seed layer is aligned with the edge of the metal feature, and an edge of the lining layer is protruded from the edge of the metal feature.

4. The semiconductor package of claim 3, wherein the lining layer and the seed layer comprise different materials.

5. The semiconductor package of claim 3, wherein each of the lining layer and the seed layer has a recess shape in cross section.

6. The semiconductor package of claim 3, wherein each of the lining layer and the seed layer has a horizontal I-shape in cross section.

7. The semiconductor package of claim 1, wherein the metal feature comprises a metal line, a metal via, a metal connector or a metal bump.

8. The semiconductor package of claim 1, wherein the redistribution layer is a lowest redistribution layer adjacent to the at least one die.

9. The semiconductor package of claim 1, wherein the edge of the seed layer structure protruded from the edge of the metal feature has a taper profile.

10. A semiconductor package, comprising:
    at least one die; and
    a redistribution layer structure disposed over and electrically to the at least one die and comprising at least one metal feature embedded by a polymer layer,
    wherein a seed layer structure is provided below the metal feature and embedded by the polymer layer, and a projecting width of the seed layer structure is greater than a projection width of the metal feature.

11. The semiconductor package of claim 10, wherein the seed layer structure has a stepped sidewall.

12. The semiconductor package of claim 10, wherein the seed layer structure comprises:
    a lining layer; and
    a seed layer located between the lining layer and the metal feature,
    wherein an edge of the seed layer is aligned with an edge of the metal feature, and an edge of the lining layer is protruded from the edge of the metal feature.

13. The semiconductor package of claim 12, wherein each of the lining layer and the seed layer has a recess shape in cross section.

14. The semiconductor package of claim 12, wherein each of the lining layer and the seed layer has a horizontal I-shape in cross section.

15. The semiconductor package of claim 10, wherein the seed layer comprises Ti, Ta, Cu, W, Ru, Co, Ni or an alloy thereof.

16. The semiconductor package of claim 10, wherein the metal feature comprises a metal line, a metal via or a metal bump.

17. A semiconductor package, comprising:
   at least one die, comprising a pad and a connector electrically connected to the pad; and
   a redistribution layer structure, disposed over and electrically to the connector of the at least one die, and comprising:
      a first via;
      a first seed layer structure, disposed between the first via and the connector of the at least one die and having a stepped sidewall;
      a first polymer layer disposed aside the first via and the first seed layer structure; and
      a first metal line disposed over the first via.

18. The semiconductor package of claim 17, wherein the first seed layer structure comprises:
   a first lining layer; and
   a first seed layer located between the first lining layer and the first via,
   wherein an edge of the first seed layer is aligned with an edge of the first via, and an edge of the first lining layer is protruded from the edge of the first via.

19. The semiconductor package of claim 17, wherein a portion of the first seed layer structure protruded from an edge of the first via has a rough and taper profile.

20. The semiconductor package of claim 17, wherein the at least one die further comprises a zeroth seed layer structure disposed between the pad and the connector, and the zeroth seed layer structure has a stepped sidewall.

* * * * *